(12) United States Patent
Liebfahrt et al.

(10) Patent No.: US 11,439,018 B2
(45) Date of Patent: *Sep. 6, 2022

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventors: Sabine Liebfahrt, Kapfenberg (AT); Ferdinand Lutschounig, Ferlach (AT); Bernhard Reitmaier, Pölstal&Möderbrugg (AT); Julia Platzer, Graz (AT); Markus Frewein, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/247,884

(22) Filed: Dec. 29, 2020

(65) Prior Publication Data

US 2022/0210920 A1    Jun. 30, 2022

(51) Int. Cl.
*H05K 1/03* (2006.01)
*H05K 1/18* (2006.01)
*H05K 3/46* (2006.01)

(52) U.S. Cl.
CPC ............. *H05K 1/183* (2013.01); *H05K 1/185* (2013.01); *H05K 3/4697* (2013.01); *H05K 2201/10393* (2013.01)

(58) Field of Classification Search
CPC ...... H05K 1/183; H05K 1/185; H05K 3/4697; H05K 2201/10393
USPC .......................................................... 174/255
See application file for complete search history.

(56) References Cited

U.S. PATENT DOCUMENTS

| | | | |
|---|---|---|---|
| 5,698,787 A * | 12/1997 | Parzuchowski | |
| 6,718,908 B1 | 4/2004 | Bayer et al. | |
| 9,433,097 B2 | 8/2016 | Tomikawa et al. | |
| 9,661,738 B1 | 5/2017 | Jacobsson et al. | |
| 9,831,163 B2 | 11/2017 | Mikado et al. | |
| 9,872,401 B2 | 1/2018 | Tomikawa et al. | |
| 10,433,413 B2 | 10/2019 | Yu et al. | |
| 2007/0284711 A1 | 12/2007 | Lee et al. | |
| 2009/0242252 A1* | 10/2009 | Tanaka | H05K 1/185 174/260 |
| 2011/0103039 A1* | 5/2011 | Nguyen Hoang | H05B 33/10 362/84 |
| 2012/0181074 A1 | 7/2012 | Ishihara et al. | |

(Continued)

FOREIGN PATENT DOCUMENTS

CN    106098648 A    11/2016
CN    106658942 A    5/2017

(Continued)

*Primary Examiner* — Andargie M Aychillhum
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure. A cavity is formed in the stack and has a non-polygonal outline. A component is in the cavity. A method of manufacturing such a component carrier is also provided.

18 Claims, 12 Drawing Sheets

(56) References Cited

U.S. PATENT DOCUMENTS

| | | |
|---|---|---|
| 2014/0227834 A1* | 8/2014 | Karpman ............ H01L 25/0652 438/126 |
| 2016/0007451 A1 | 1/2016 | Tomikawa et al. |
| 2016/0007468 A1 | 1/2016 | Tomikawa et al. |
| 2016/0037620 A1 | 2/2016 | Kang et al. |
| 2016/0050771 A1 | 2/2016 | Yu et al. |
| 2016/0150643 A1 | 5/2016 | Lee |
| 2016/0192471 A1 | 6/2016 | Min et al. |
| 2016/0242293 A1* | 8/2016 | Mikado ................ H05K 3/4697 |
| 2016/0268189 A1 | 9/2016 | Mikado et al. |
| 2016/0338211 A1 | 11/2016 | Ha et al. |
| 2016/0374189 A1 | 12/2016 | Lee |
| 2017/0094773 A1 | 3/2017 | Seo et al. |
| 2017/0135196 A1 | 5/2017 | Kim et al. |
| 2018/0025956 A1 | 1/2018 | Cheng |
| 2020/0100393 A1 | 3/2020 | Xiang et al. |

FOREIGN PATENT DOCUMENTS

| | | |
|---|---|---|
| CN | 107079582 A | 8/2017 |
| CN | 107222983 A | 9/2017 |
| CN | 107734836 A | 2/2018 |
| CN | 107889345 A | 4/2018 |
| CN | 207369400 U | 5/2018 |
| CN | 108135070 A | 6/2018 |
| CN | 108419361 A | 8/2018 |
| CN | 108601206 A | 9/2018 |
| CN | 108650781 A | 10/2018 |
| CN | 108882538 A | 11/2018 |
| DE | 20 2016 007 958 U1 | 1/2017 |
| DE | 10 2018 204 552 A1 | 9/2019 |
| EP | 3 008 753 B1 | 11/2016 |
| EP | 3 148 298 A1 | 3/2017 |
| EP | 3 199 001 A1 | 8/2017 |
| TW | 201603673 A | 1/2016 |
| TW | I544850 B | 8/2016 |

\* cited by examiner

COMPONENT CARRIER AND METHOD OF MANUFACTURING THE SAME

TECHNICAL FIELD

The disclosure relates to a component carrier and to a method of manufacturing the same.

BACKGROUND

A conventional component carrier comprises a stack having electrically conductive layer structures and electrically insulating layer structures. A cavity is formed in the stack, and a component is embedded in the cavity. Some component carriers comprise a printed circuit board having a cavity, in which a component of a high thermally conductive dielectric material is embedded. Some of these components of high thermally conductive dielectric material can be brittle and can break, especially during a placement of the component into a cavity of a component carrier stack and during a final lamination of the stack with the component placed therein.

SUMMARY

There may be a need to provide a component carrier and a method of manufacturing the same, which enable a more robust and reliable component carrier which is easy to manufacture with reduced rejects due to defects.

This need is achieved by a component carrier and a method of manufacturing a component carrier according to the independent claims.

According to an exemplary embodiment of the invention, a component carrier is provided. The component carrier comprises a stack comprising at least one electrically conductive layer structure and/or at least one electrically insulating layer structure; a cavity formed in the stack and having a non-polygonal outline; and a component in the cavity.

According to another exemplary embodiment of the invention, a method of manufacturing a component carrier is provided. The method comprises steps of providing a stack comprising at least one electrically conductive layer structure and/or at least one electrically insulating layer structure; forming in the stack a cavity having a non-polygonal outline; and inserting a component in the cavity.

OVERVIEW OF EMBODIMENTS

A stress lowering effect in the component carrier could be observed due to the non-polygonal outline of the cavity.

In an embodiment, at least a part of corners of the outline is rounded.

In an embodiment, a rounding in a corner of the outline has a radius of at least 0.05 mm, in particular at least 0.2 mm, more particularly at least 1 mm.

In an embodiment, the outline is substantially rectangular with rounded, in particular circular, extensions in at least a part of corners, in particular in all corners, of the outline. Such a non-polygonal outline is easy to manufacture.

In an embodiment, the outline is at least partly rounded along its entire perimeter, in particular has circular, oval or ellipsoidal portions. In an embodiment, at least part of edges of the outline is rounded, in particular comprises a wave structure. Advantageously, the circular, oval or ellipsoidal portions and the wave structure allow for an additional increase in placement and registration accuracy of the component. A stress relaxation can be achieved due to an adapted cavity size and form.

In an embodiment, the component has a polygonal outline, in particular a rectangular outline.

In an embodiment, the component has a rounded outline, in particular with circular, oval or ellipsoidal portions.

In an embodiment, a volume between the component and walls of the stack delimiting the cavity is configured as a stress buffer. For example, the volume can be filled by a resin from the electrically insulating layer structure during laminating the stack. The resin can compensate for different coefficients of thermal expansion (CTE) between the stack and the component. For example, a resin flows into the (bulged) roundings at the corners of the cavity and a resin excess is created there, which is further helpful for compensating the CTE mismatch.

In an embodiment, a volume between the component and walls of the stack delimiting the cavity is at least partially filled with a fiber-free resin. In an embodiment, the fiber-free resin is inserted into the volume by laminating at least one further at least partially uncured electrically insulating layer structure on the stack and the component in the cavity. The fiber-free resin enables an appropriate resin flow, an improved (gap) filling, and can compensate for a possible CTE mismatch.

In an embodiment, the at least one electrically insulating layer structure has sidewalls delimiting at least part of the cavity and comprises fibers so that the component carrier, in particular the stack, is more robust and exhibits less warpage.

In an embodiment, the component is a ceramic block, in particular having a metal cladding on at least part of at least one of its two opposing main surfaces, for example a copper-cladded AlN (Aluminum Nitride)-Inlay. In a modification, the component can be or comprise a copper block.

In an embodiment, a difference between an area delimited by the outline and an area of the component is adjusted to be substantially proportional to a square root of the area of the component.

In an embodiment, the component has a stepped profile at at least one of its main surfaces and is laterally engaged by a resin clamping structure. The clamping effect, preferably together with the ability of a cured resin of the electrically insulating layer structure of the stack to adapt to the surfaces of the component and the cavity, increases the stability of the component carrier. In another embodiment, this effect can also be achieved by a component having chamfered edges. If the component is a block of an insulating material, in particular a ceramic block, a metal cladding in the shape of metal layers such as copper layers can be provided on at least part of at least one of its two opposing main surfaces (for example a copper-cladded AlN (Aluminum Nitride)-Inlay). The metal layers can be retracted from edges of the block. It is also conceivable that the component is or comprises a structured metal block such as a structured copper block, wherein the stepped profile at at least one of its main surfaces is achieved by structuring the at least one main surface of the metal block.

In an embodiment of the method, a difference between an area delimited by the outline and an area of the component is adjusted to be substantially proportional to a square root of the area of the component.

In an embodiment of the method, the component has a stepped profile at at least one of its main surfaces and is laterally engaged by a resin clamping structure.

In the following, further exemplary embodiments of the present invention will be explained.

In the context of the present application, the term "non-polygonal outline' may particularly denote an outline which does not define a polygon in its entirety. A polygon generally is a plane geometrical figure that is defined by a finite number of straight-line segments which are connected to form a closed chain or circuit. For example, any plane geometrical figure, which does not fulfill this condition, can be considered as a non-polygonal outline.

In the context of the present application, the term "stepped profile" may particularly denote a shoulder or a level difference of stacked layers, in particular where an upper layer is retracted from an edge of a subjacent layer. A stepped profile may also be formed by chamfered edges.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "electronic component" may particularly denote a component fulfilling an electronic task. For instance, such an electronic component may be a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photo-imageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photo-imageable dielectric materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular materials coated with supra-conductive material or conductive polymers, such as graphene or poly (3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic or soft magnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
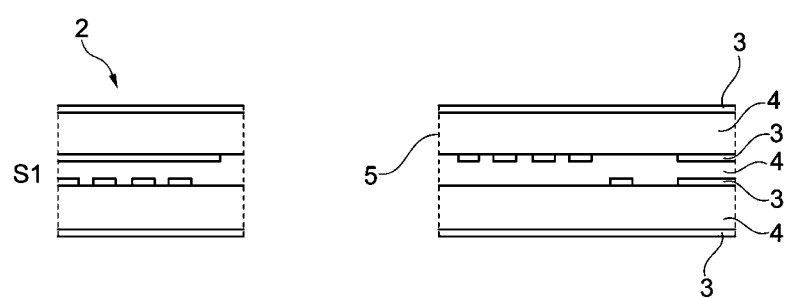
FIG. 1 illustrates steps of a method of manufacturing a component carrier according to an exemplary embodiment of the invention.
Figure 2:
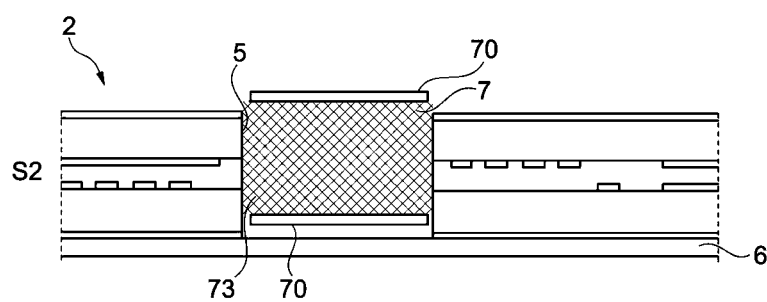
FIG. 2 illustrates steps of the method of manufacturing a component carrier according to the exemplary embodiment of the invention.
Figure 3:
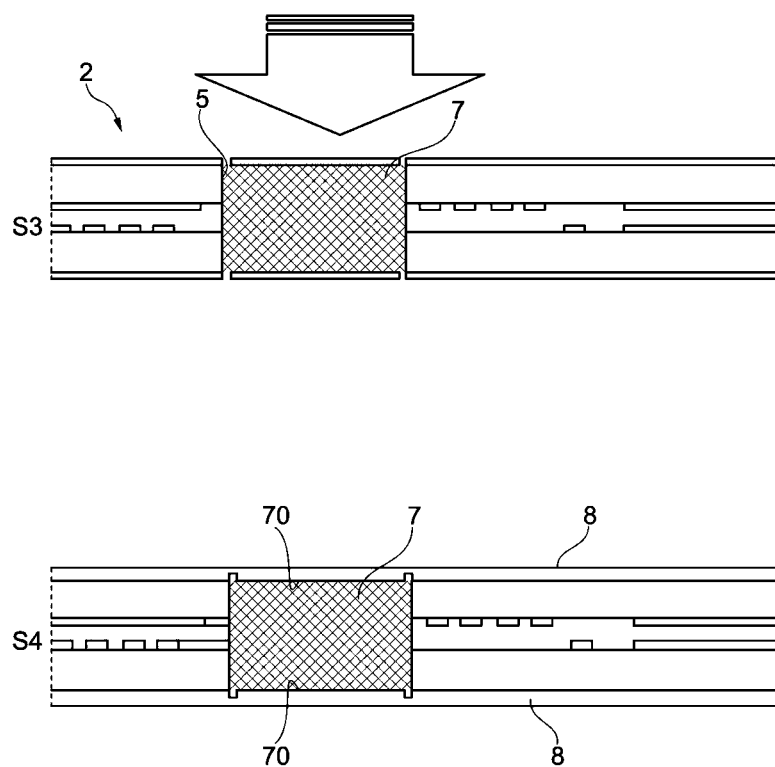
FIG. 3 illustrates steps of the method of manufacturing a component carrier according to the exemplary embodiment of the invention.
Figure 4:
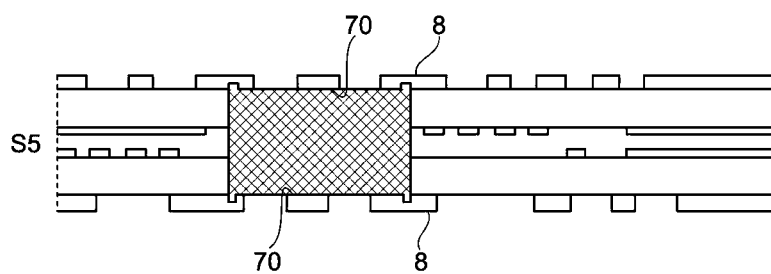
FIG. 4 illustrates steps of the method of manufacturing a component carrier according to the exemplary embodiment of the invention.

The illustrations in the drawings are schematically presented. In different drawings, similar or identical elements are provided with the same reference signs.

FIG. 1 to FIG. 4 illustrate steps of the method of manufacturing a component carrier according to an exemplary embodiment of the invention.

A precured stack 2, for example a printed circuit board (PCB), comprises electrically conductive layer structures 3 and electrically insulating layer structures 4. In a step S1, a cavity 5 is milled in the stack 2. The precured stack 2 is a B-stage material, but can consist also out of C-Stage material. The cavity 5 has a non-polygonal outline in a plan view, which is described later in more detail.

In a step S2, a component 7 such as an inlay is inserted into the cavity 5. A temporary carrier 6 carries and holds at least one component 7. The component or inlay 7 can comprise a ceramic block 73, in particular having a metal cladding or metal layers 70 on at least part of at least one of its two opposing main surfaces (for example a copper-cladded AlN (Aluminum Nitride)-inlay). In a plan view, an inlay area can be in a range between 2 $mm^2$ and 2500 $mm^2$. The sizes are examples and can be bigger and smaller.

In a step S3, a lamination of the stack 2 with the component 7 inserted in the cavity 5 is performed. During this lamination, the resin in the gap between the stack 2 and the component 7 becomes a C-stage material with substantially all polymer chains crosslinked. Thereby, it solidifies and is hardened. In a step S4, a metal layer 8 such as a copper plating is provided on the top surface and on the bottom surface of the stack 2, wherein also top and bottom surfaces of the component 7, in particular the metal layers 70, can also be plated.

In a step S5, the plated metal layers 8 provided in step S4, and optionally the metal layers 70 and/or or subjacent metal layers in the stack 2, are patterned or structured, for example by conventional lithography and etching processes.

Figure 5:
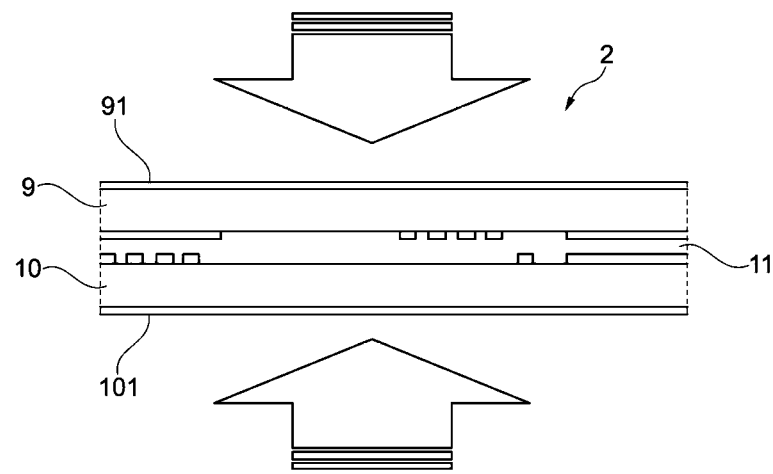
FIG. 5 illustrates a step of the method of manufacturing a component carrier according to the exemplary embodiment of the invention.

FIG. 5 illustrates a first embodiment which can be performed before step S1 in FIG. 1. In this embodiment, the stack 2 comprises a first core layer 9 of a C-stage material and a second core layer 10 of a C-stage material, each of which is coated on one side by a metal layer 91, 101 such as a copper layer. The coated metal layers 91, 101 represent outer surfaces of the stack 2. Between the first and second core layers 9, 10 of the C-stage material, a prepreg 11 of a B-stage material is sandwiched. The thus layered stack 2 is laminated.

Figure 6:
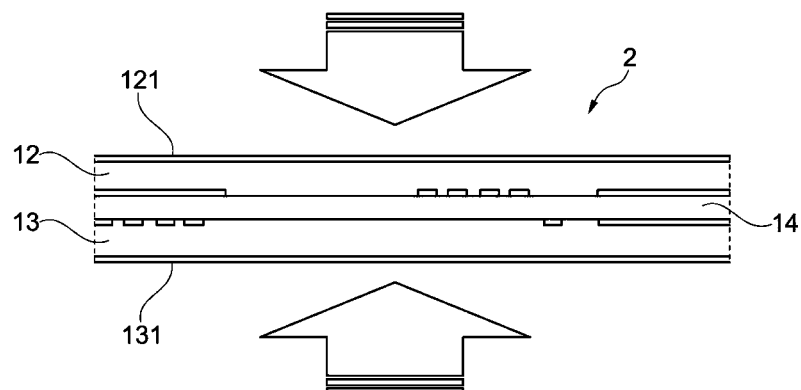
FIG. 6 illustrates a step of the method of manufacturing a component carrier according to the exemplary embodiment of the invention.

FIG. 6 illustrates a second embodiment which can be performed before step S1 in FIG. 1. In this embodiment, the stack 2 comprises a first layer 12 of a B-stage material and a second layer 13 of a B-stage material, each of which is coated on one side by a metal layer 121, 131 such as a copper layer. The coated metal layers 121, 131 represent outer surfaces of the stack 2. Between the first and second layers 12, 13 of the B-stage material, a core 14, in particular a structured core of a C-stage material, is sandwiched. The thus layered stack 2 is laminated.

Figure 7:
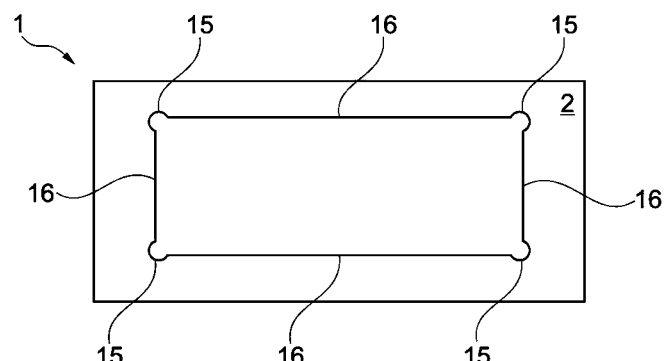
FIG. 7 illustrates an outline of a cavity in a component carrier according to an exemplary embodiment of the invention.

FIG. 7 illustrates an outline of a cavity 5 in a component carrier 1 according to an exemplary embodiment of the invention. The cavity 5 formed in the stack 2 has an outline which is defined by corners 15 and sidewalls 16, which are substantially linear in this embodiment. The outline is substantially rectangular with rounded, circular extensions in the corners 15 of the outline. As a result, the cavity 5 has a non-polygonal outline. A polygon generally is a plane geometrical figure that is defined by a finite number of straight-line segments which are connected to form a closed chain or circuit. Any plane geometrical figure, which does not fulfill this condition, can be considered as a non-polygonal outline.

In the embodiment of FIG. 7, all corners 15 of the outline are rounded. Alternatively, only a part of the corners 15 of the outline can be rounded, for instance corners 15 which are subjected to higher stresses than the remaining corners 15. A rounding in a corner 15 of the outline can have a radius of at least 0.05 mm, in particular at least 0.2 mm, more particularly at least 1 mm. In the embodiment of FIG. 7, the outline is substantially rectangular with the rounded, circular extensions in the corners 15 of the outline. The circular extensions in the corners 15 of the outline are bulged or convex structures, which means that a width and/or a length of the cavity 5 at the corners 15 is here larger than at other portions of the outline of the cavity 5.

Figure 8:
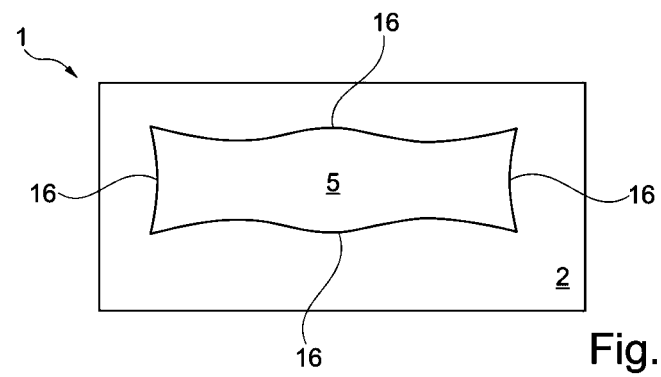
FIG. 8 illustrates an outline of a cavity in a component carrier according to an exemplary embodiment of the invention.

FIG. 8 illustrates an outline of a cavity 5 in a component carrier 1 according to an exemplary embodiment of the invention. At least part of edges or sidewalls 16 of the outline is rounded, in particular comprises a wave structure. Advantageously, the wave structure allows for an additional increase in placement and registration accuracy of the component 7. In another embodiment, the outline can be rounded along its entire perimeter. In particular, the outline can comprise circular, oval or ellipsoidal portions. More particular, the outline can be oval or ellipsoidal in its entirety.

Figure 9:
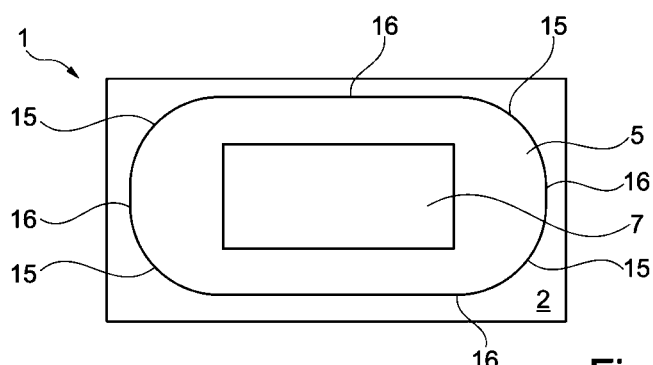
FIG. 9 illustrates an outline of a cavity in a component carrier according to an exemplary embodiment of the invention.

FIG. 9 illustrates an outline of a cavity 5 in a component carrier 1 according to an exemplary embodiment of the invention. The outline is partly rounded along its entire perimeter, in particular has circular, oval or ellipsoidal portions. In more detail, the outline comprises two long opposed straight lines 16 at the top and the bottom in FIG. 9, two short opposed straight lines 16 at the left-hand side and at the right-hand side in FIG. 9, and four rounded portions at each of the corners 15 of the cavity 5 in FIG. 9. In other words, two straight lines 16 are connected by a rounded portion. The rounded portions can be circular, oval or ellipsoidal portions. In a modification, the two short opposed straight lines 16 at the left-hand side and at the right-hand side in FIG. 9 can be omitted.

The component 7 inside the cavity has a polygonal outline, in particular a rectangular outline. Such a component 7 can also be inserted in anyone of the other embodiments. In a modification, the component 7 can have a rounded outline, in particular with circular, oval or ellipsoidal portions. In particular, the component 7 can have a complementary shape to the cavity 5.

In the embodiments of FIG. 7 to FIG. 9, a stress lowering effect could be observed when using a rounding or radius in the cavity corners 15 and/or a spline shaped cavity 5, which effect is described later in more detail.

By formula, for instance, a difference between an area delimited by the outline of the cavity 5 and an area of the component 7 can be adjusted to be substantially proportional to a square root of the area of the component 7. In an embodiment, the minimum oversize of the cavity area can correspond to the formula $y=0.3319 \cdot x^{0.5}$, and the maximum oversize of the cavity area can correspond to the formula $y=0.5319 \cdot x^{0.5}$, where y is the difference between the cavity area and the component area, and x is the component area.

The gap between the component 7 and the stack 2 is filled with resin 20 from at least one of the electrically insulating layer structures 4 of the stack 2 during the laminating process. The aim is to clamp the component 7 with this resin flow. The bulged roundings at the corners 15 protect the corners 15 of the component 7 and support the even resin flow (see FIG. 10) into the gap between component 7 and the stack 2.

Figure 10:
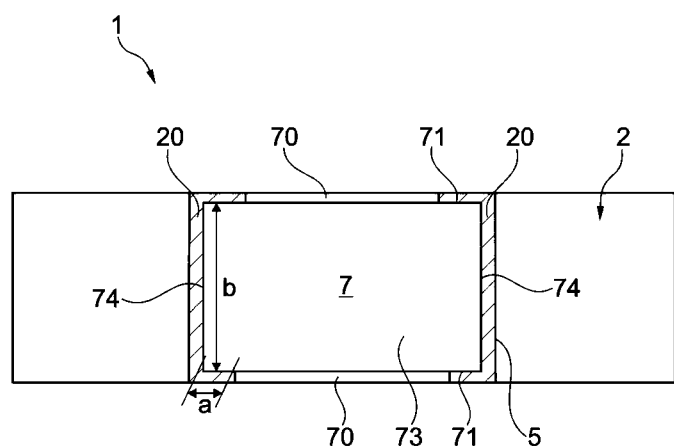
FIG. 10 illustrates a cross-section of a component carrier according to an exemplary embodiment of the invention.

FIG. 10 illustrates a cross-section of a component carrier 1 according to an exemplary embodiment of the invention. The component 7 has a stepped profile at least one of its main surfaces and is laterally engaged by a resin clamping structure which is, for example, formed by the resin 20 from at least one of the electrically insulating layer structures 4 of the stack 2 during the lamination process.

The component 7 can comprise a block 73, which is or comprises an insulating material, for example a ceramic material. Thus, the block 73 can be a ceramic block, in particular a block having a metal cladding on at least part of at least one of its two opposing main surfaces, for example a copper-cladded AlN (Aluminum Nitride)-Inlay. The metal cladding can be formed by metal layers 70. The metal layers 70 (for example copper layers or copper surfaces) on the block 73 can be retracted from the edge of the block 73. Reference sign 71 designates exposed surfaces of the block 73, where the metal layers 70 are not provided. The exposed surfaces 71 are covered by the resin 20 from at least one of the electrically insulating layer structures 4 of the stack 2 during the lamination process so that the above-mentioned resin clamping structure is formed.

Since the metal layers 70 (for example the copper layers or copper surfaces) on the component 7 are retracted from the edges of the block 73, for example by a length of approximately 100 μm, which length is designated by reference sign "a" in FIG. 10, the clamping effect is achieved. However, the metal layers 70 can also be retracted from the edges of the block 73 in the range from some nanometers to some centimeters. The difference between the upper or lower area of the component 7 and the retracted area of the metal layer 70 can be between $1 \times 1$ μm² and $1 \times 1$ mm², in particular between $200 \times 200$ μm² and $800 \times 800$ μm², more particular between $400 \times 400$ μm² and $600 \times 600$ μm².

This clamping effect and the ability of the resin 20 to adapt to the surfaces of the component 7 and the cavity 5 increases the stability of the component carrier 1. The roughness of the component 7 can be any roughness. As shown in FIG. 10, a ratio of a long side "b" of the stack 2, for example a height of the block 73, to the short length "a" can be between 2:1 and 1000:1, in particular between 5:1 to 100:1, more particular between 10:1 to 50:1.

The stepped profile is thus formed by a level difference between the exposed surface 71 and the metal layer 70. The resin clamping structure laterally engages the component 7 and extends up to a step of the stepped profile 70, 71.

The component has a first stepped profile 70, 71 on an upper main surface, and a second stepped profile 70, 71 on a lower main surface. The stepped profile 70, 71 is formed by the cuboid main body formed by the block 73 of the component 7 and a confined sheet structure formed by the metal layer 70 on only part of a main surface of the main body 73.

Preferably, the main body 73 is made of another material, in particular the ceramic such as aluminum nitride, than a material of the sheet structure 70, in particular a metal such as copper.

In a modification, the main body 73 and the sheet structure 70 are integrally formed, in particular from a metal such as copper. In other words, the component 7 can comprise or be a metal block such as pure copper block, which for example serves as a heat sink. The metal block can preferably be structured to have a stepped profile at at least one of its main surfaces and to be laterally engaged by a resin clamping structure which is, for example, formed by the resin 20 from at least one of the electrically insulating layer structures 4 of the stack 2 during the lamination process.

The resin clamping structure 20 laterally engages an entire sidewall 74 and a sub-portion, which is formed of the exposed surfaces 71, of a horizontal (main) surface of the component 7.

At the left-hand side and the right-hand side in FIG. 10, the first stepped profiles 70, 71 at the top of the component 7 are provided at both sidewalls 74 of the component 7 so that the resin clamping structure, which is, for example, formed by the resin 20, laterally engages an entire first sidewall 74 and a first sub-portion 71 of a horizontal surface of the component 7 (at the right-hand side in FIG. 10) and laterally engages an entire second sidewall 74 and a second sub-portion 71 of a horizontal surface of the component (at the left-hand side in FIG. 10).

At the left-hand side and the right-hand side in FIG. 10, the second stepped profiles 70, 71 at the bottom of the component 7 are provided at both sidewalls 74 of the component 7 so that the resin clamping structure, which is, for example, formed by the resin 20, laterally engages an entire first sidewall 74 and a first sub-portion 71 of a horizontal surface of the component 7 (at the right-hand side in FIG. 10) and laterally engages an entire second sidewall 74 and a second sub-portion 71 of a horizontal surface of the component (at the left-hand side in FIG. 10).

As a result, the resin clamping structure formed by the resin 20 is substantially C-shaped, in particular comprises two opposing substantially C-shaped elements.

Preferably, the resin clamping structure is free of fibers so that a resin flow is enhanced. In a modification, the at least one electrically insulating layer structure 4 has sidewalls delimiting at least part of the cavity 5 and comprises glass particles, carbon nano tubes/fibers, fibers, or ceramic particles to improve the strength of the resin clamping structure.

Figure 11:
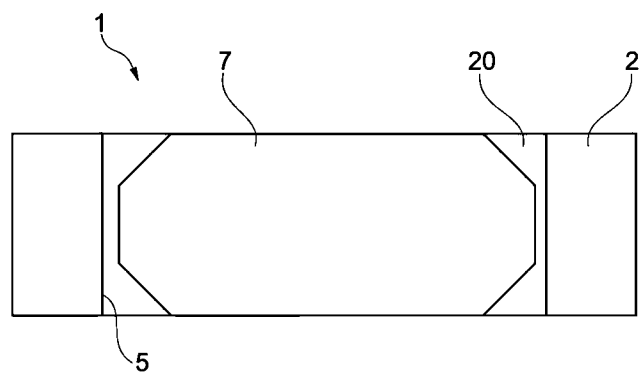
FIG. 11 illustrates a cross-section of a component carrier according to an exemplary embodiment of the invention.

FIG. 11 illustrates a cross-section of a component carrier 1 according to an exemplary embodiment of the invention. This embodiment visualizes the clamping effect of the resin 20. The component shape, for example as shown in FIG. 11, also has a positive effect on this property because the edges of the component 7 are chamfered.

In the above-described embodiments, a volume between the component 7 and the sidewalls 16 of the stack 2 delimiting the cavity 5 can be at least partially filled with a fiber-free resin 20, for example if the at least one electrically insulating layer structure 4 of the stack 2 is fiber-free, so that a resin flow is enhanced. In another embodiment, the at least one electrically insulating layer structure 4 can have sidewalls delimiting at least part of the cavity 5 and comprises fibers to enhance the strength of the resin clamping structure and to reduce warpage of the component carrier 1.

Figure 12:
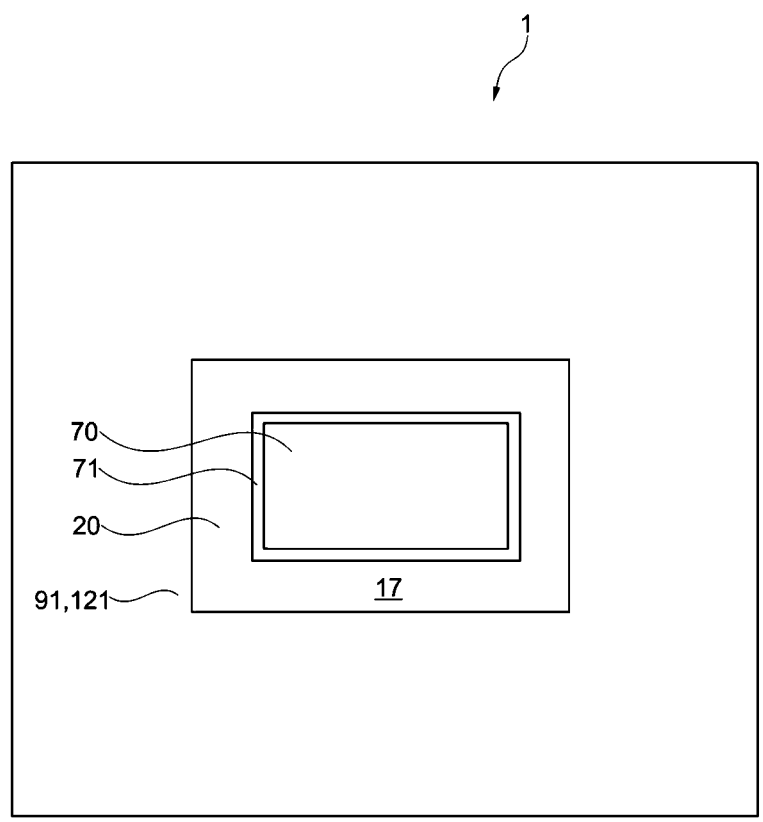
FIG. 12 illustrates a plan view of a component carrier according to an exemplary embodiment of the invention.

FIG. 12 illustrates a plan view of a component carrier 1 according to an exemplary embodiment of the invention. The component 7 is embodied as an inlay having retracted metal layers 70 such as copper surfaces thereon, for example the component 7 is embodied as a copper-cladded AlN (Aluminum-Nitride)-inlay. Reference sign 71 designates the exposed AlN surface of the component 7, where the metal layers 70 are not provided. This embodiment visualizes another effect which is achieved by the pure resin 20 that has flowed during lamination from the stack 2 into the gap between the stack 2 and the component 7, as the resin 20 has a different coefficient of thermal expansion (CTE) than the stack 2 with the copper surface 91, 121, or the component 7. The desired effect is that the component 7 can thermally deform without leaving any damage to the finished stack 2. The stress can thus relax into the resin 20. As a result, a volume between the component 7 and the sidewalls 16 of the stack 2 delimiting the cavity 5 is configured as a stress buffer. Another result is that metal layers such as copper tracks of the finished component carrier 1 are very thin in this transition area on the exposed AlN surface 71 in FIG. 10, so that less heat is transferred and therefore less stress is exerted on the edges of the component 7. In order to maintain the desired conductivity of the copper tracks, this transition area between the metal layers 91, 121 of the stack 2 and the metal layer 70 of the component 7 can be about 200 μm+/−50 μm, in particular 200 μm+/−25% as shown in FIG. 12.

Figure 13:
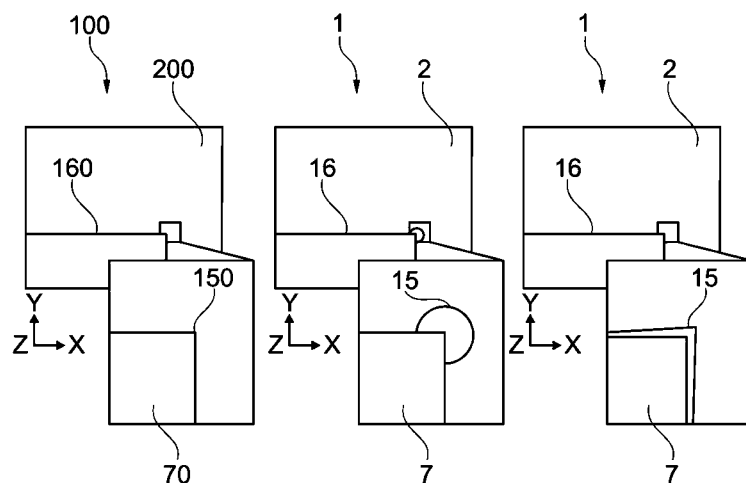
FIG. 13 illustrates different plan views of a corner in a cavity of a component carrier according to the prior art and exemplary embodiments of the invention.

FIG. 13 illustrates different plan views of a corner 15, 150 in a cavity 5, 50 of a component carrier 1, 100 according to exemplary embodiments of the invention and the prior art. The left-hand embodiment in FIG. 13 illustrates a prior art component carrier 100, where the component 70 and the cavity 50 each have sharp corners 150 of 90°. The middle embodiment in FIG. 13 illustrates a component carrier 1 according to an embodiment of the present invention, where the outline of the cavity 5 is substantially rectangular with rounded, circular extensions in all corners 15 of the outline. The right-hand embodiment in FIG. 13 illustrates a component carrier 1 according to an embodiment of the present invention, where at least part of edges 16 of the outline comprises a wave structure.

Figure 14:
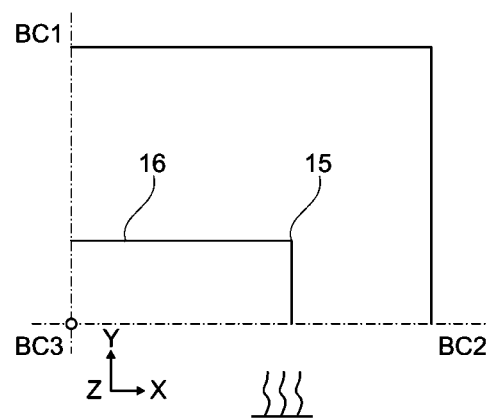
FIG. 14 illustrates boundary conditions to simulate stress inside a cavity.

FIG. 14 illustrates boundary conditions to simulate stress inside a cavity 5. The boundary conditions are used to simulation stresses in the cavity 5. BC1 respectively shows the symmetry boundary to the global x axis, and BC2 to the global y axis. The BC3 restricts all degrees of freedom in the model. The temperature field is applied by a so called "predefined field" boundary condition, uniformly through the whole model.

Figure 15:
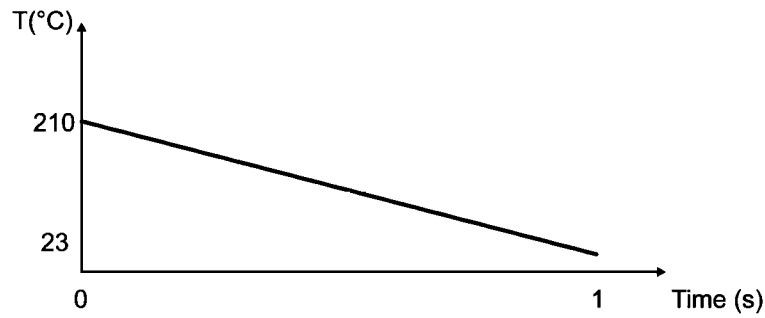
FIG. 15 illustrates a temperature profile for simulation.

FIG. 15 illustrates a temperature profile for simulation, which temperature profile is applied by the so called "predefined field" boundary condition. The model is stress free at 240° C. A non-linear static simulation step is applied by 1 s. The model cools to 23° C. Within this simulation procedure, the thermo-mechanical stress is introduced to the model and can be evaluated for further criticality analysis.

Figure 16:
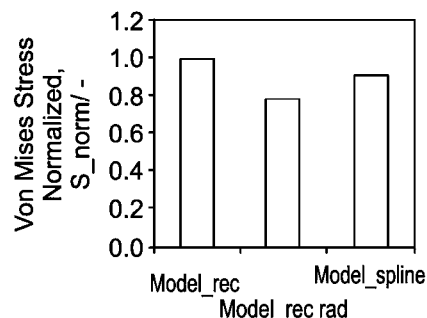
FIG. 16 illustrates comparison results of Von-Mises stresses in the system in FIG. 13.
Figure 17:
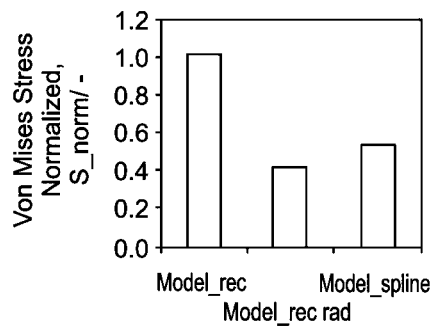
FIG. 17 illustrates comparison results of normalized Von-Mises stresses in the cavity in FIG. 13.

FIG. 16 illustrates bar charts of comparison results of normalized Von-Mises stresses in the system in FIG. 13. FIG. 17 illustrates bar charts of comparison results of normalized Von-Mises stresses in the cavity in FIG. 13. The stresses in the prior art component carrier 100 at the left-hand side of FIG. 13 are normalized to 1 as shown in the left-hand side in FIGS. 16 and 17. The stresses in the component carrier 1 of the embodiment in the middle of FIG. 13 are 0.8 and 0.4, respectively, as shown in middle in FIGS. 16 and 17. The stresses in the component carrier 1 of the embodiment at the right-hand side of FIG. 13 are 0.9 and 0.5, respectively, as shown in the right-hand side in FIGS. 16 and 17. As a result, it is proved that the component carrier 1 of the present invention exhibits remarkably reduced stresses compared with the prior art component carrier 100. A stress lowering effect could be observed when using a radius in the cavity corners 15 and/or a spline shaped cavity 5.

Figure 18:
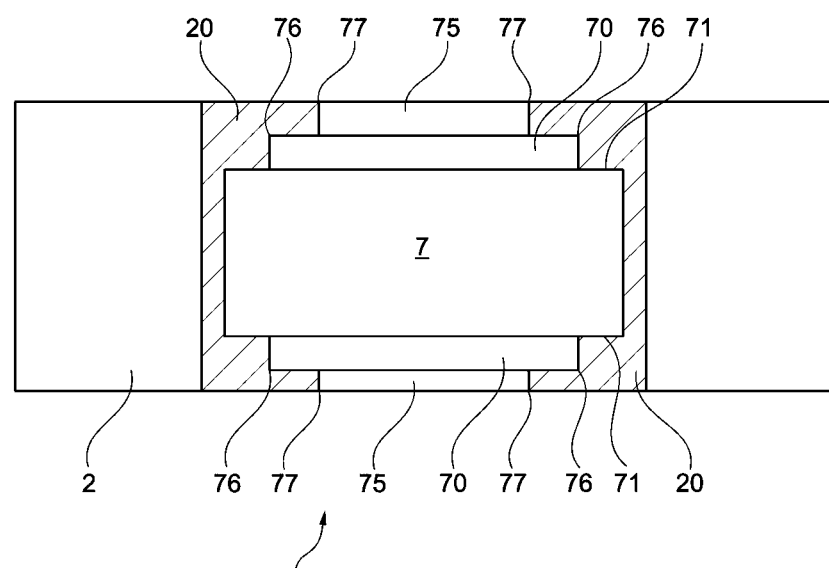
FIG. 18 illustrates a cross-section of a component carrier according to an exemplary embodiment of the invention.

FIG. 18 illustrates a cross-section of a component carrier 1 according to an exemplary embodiment of the invention. The resin clamping structure, which is for example formed by the cured resin 20 from one of the electrically insulating layer structures 4 of the stack 2 during lamination, laterally extends up to a first step 76 of the first stepped profile 70, 71 and up to a second step 77 of a second stepped profile 70, 75. Each first step 76 is formed by the metal layer 70 and the exposed surface 71, and each second step 77 is formed by the metal layer 70 and a further metal layer 75 on top of the metal layer 70. The further metal layer 75 is retracted from an edge of the metal layer 70.

Figure 19:
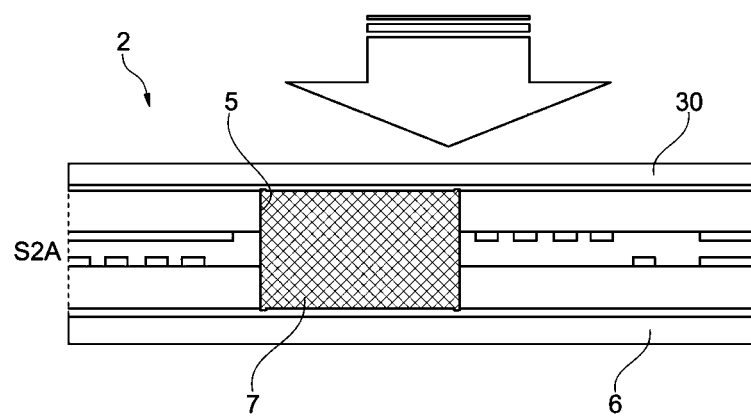
FIG. 19 illustrates a step of the method of manufacturing a component carrier according to the exemplary embodiment of the invention.

FIG. 19 illustrates a step S2A of the method of manufacturing a component carrier 1 according to the exemplary embodiment of the invention. The step S2A can be performed after step S2 in FIG. 2. In the embodiment of FIG. 19, the resin clamping structure can be inserted into the cavity 5 by laminating at least one further at least partially uncured electrically insulating layer structure 30 on the stack 2 and the component 7 in the cavity 5. The at least one further at least partially uncured electrically insulating layer structure 30 can be a fiber-free resin 20 so that the resin flow is enhanced.

Optionally, also one of the (internal) electrically insulating layer structures 4 of the stack 2 can additionally be cured during the lamination.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
a stack comprising at least one electrically conductive layer structure and/or at least one electrically insulating layer structure;
a cavity formed in the stack, the cavity having a non-polygonal outline; and
a component in the cavity, the component having a linear sidewall adjacent to a nonlinear portion of the cavity.

2. The component carrier according to claim 1, wherein the non-polygonal outline includes a discontinuity.

3. The component carrier according to claim 1, wherein a rounding in a corner of the non-polygonal outline has a radius of at least 0.05 mm.

4. The component carrier according to claim 1, wherein the non-polygonal outline is substantially rectangular with an extension in at least one corner of the non-polygonal outline.

5. The component carrier according to claim 1, wherein the non-polygonal outline is nonlinear along its entire perimeter.

6. The component carrier according to claim 1, wherein at least a portion of the non-polygonal outline is rounded.

7. The component carrier according to claim 1, wherein the component has a polygonal outline.

8. The component carrier according to claim 1, wherein the component has a chamfered edge.

9. The component carrier according to claim 1, wherein a volume between the component and walls of the stack delimiting the cavity is configured as a stress buffer.

10. The component carrier according to claim 1, wherein a volume between the component and walls of the stack delimiting the cavity is at least partially filled with a fiber-free resin.

11. The component carrier according to claim 10, wherein the fiber-free resin is inserted into the volume by laminating at least one further at least partially uncured electrically insulating layer structure on the stack and the component in the cavity.

12. The component carrier according to claim 1, wherein the at least one electrically insulating layer structure has sidewalls delimiting at least a part of the cavity and comprises fibers.

13. The component carrier according to claim 1, wherein the component is a ceramic block or a copper block.

14. The component carrier according to claim 1, wherein a difference between an area delimited by the outline and an area of the component is adjusted to be substantially proportional to a square root of the area of the component.

15. The component carrier according to claim 1, wherein the component has a stepped profile at at least one of its main surfaces and is laterally engaged by a resin clamping structure.

16. A method of manufacturing a component carrier, the method comprising:
providing a stack comprising at least one electrically conductive layer structure and/or at least one electrically insulating layer structure;
forming in the stack a cavity having a non-polygonal outline; and
inserting a component in the cavity, the component having a linear sidewall adjacent to a nonlinear portion of the cavity.

17. The method according to claim 16, wherein a difference between an area delimited by the non-polygonal outline and an area of the component is adjusted to be substantially proportional to a square root of the area of the component.

18. The method according to claim 16, wherein the component has a stepped profile at at least one of its main surfaces and is laterally engaged by a resin clamping structure.

* * * * *